United States Patent [19]

Ichikawa

[11] Patent Number: 5,516,251

[45] Date of Patent: May 14, 1996

[54] MAGAZINE CARRYING APPARATUS

[75] Inventor: Shigeru Ichikawa, Tokyo, Japan

[73] Assignee: Kabushiki Kaisha Shinkawa, Tokyo, Japan

[21] Appl. No.: 289,299

[22] Filed: Aug. 11, 1994

[30] Foreign Application Priority Data

Aug. 12, 1993 [JP] Japan .................... 5-219239

[51] Int. Cl.⁶ .................................................. B65G 1/04
[52] U.S. Cl. ........................................ 414/331; 414/416
[58] Field of Search .................... 414/225, 331, 414/403, 416, 785, 609, 610, 618, 940

[56] References Cited

U.S. PATENT DOCUMENTS

| | | | |
|---|---|---|---|
| 3,823,836 | 7/1974 | Cheney et al. ...................... | 414/225 |
| 4,457,662 | 7/1984 | Ireland et al. ...................... | 414/331 |
| 4,676,709 | 6/1987 | Bonora et al. ..................... | 414/940 X |
| 4,712,963 | 12/1987 | Kondo ............................... | 414/331 X |
| 4,759,681 | 7/1988 | Nogami ............................. | 414/416 X |
| 4,836,733 | 6/1989 | Hertel et al. ...................... | 414/416 X |
| 4,875,825 | 10/1989 | Tullis et al. ...................... | 414/940 X |
| 5,048,164 | 9/1991 | Harima ............................. | 414/940 X |
| 5,302,077 | 4/1994 | Sato et al. ........................ | 414/331 X |
| 5,358,375 | 10/1994 | Kawada et al. ................... | 414/331 X |
| 5,368,466 | 11/1994 | Hehl ................................. | 414/331 X |

FOREIGN PATENT DOCUMENTS 5-166851 7/1993 Japan .

*Primary Examiner*—James W. Keenan
*Attorney, Agent, or Firm*—Koda and Androlia

[57] ABSTRACT

An apparatus for carrying a magazine for lead frames used in, for example, a wire bonding machine including a magazine loader stage, a magazine unloader stage, and a vertically moving elevator that carries the magazine from the loader stage to the unloader stage, and the elevator is provided with a chucking device that securely hold the magazine in the elevator so that the magazine in the elevator is prevented from moving around.

2 Claims, 4 Drawing Sheets

MAGAZINE CARRYING APPARATUS

BACKGROUND OF THE INVENTION

1. Field of the Invention

The present invention relates to a magazine carrying apparatus that carries a magazine from a magazine loader stage to a lead frame discharge position and then to a magazine unloader stage.

2. Prior Art

One example of a magazine carrying apparatus is disclosed in the Japanese Patent Application Laid-Open (Kokai) No. 5-166851.

This magazine carrying apparatus includes a loader stage that supplies magazines and an unloader stage that receives the magazines. The loader stage and the unloader stages are installed vertically, the unloader stage and the loader stage and the unloader stage being in a parallel positional relationship being directly above the loader stage. This carrying apparatus further includes a vertically movable elevator. The elevator receives the magazine, that contains lead frames therein, from the loader stage and is raised to a lead frame discharge position. When the lead frames are taken out of the magazine at this lead frame discharge position, the elevator moves the magazine to the unloader stage so that the magazine is transferred onto the unloader stage.

The elevator can also be used to move the magazine between the loader stage and the unloader stage so that lead frames are put into an empty magazine.

However, in the this prior art magazine carrying apparatus, the magazine is merely set in the elevator without being positionally secured. As a result, when the elevator jolts, the magazine is moved and displaced in the elevator. Such a displacement of the magazine would prevent a smooth discharge operation of the lead frames out of the magazine. In addition, if the magazine is merely placed in the elevator, a high speed operation of the elevator is not executed because the magazine might drop when the elevator moves fast.

SUMMARY OF THE INVENTION

Accordingly, the object of the present invention is to provide a magazine carrying apparatus that can securely hold the magazine in the elevator so that a smooth discharge and storage operation of the lead frames into and out of the magazine is accomplished and a high speed operation of the elevator can be executed.

The above described object of the present invention is achieved by a unique structure in a magazine carrying apparatus which includes a loader stage that supplies a magazine, an unloader stage that receives the magazine, and a vertically movable elevator. The elevator is moved between the loader stage and the unloader stage which are vertically installed so that the elevator receives therein the magazine at the loader stage, carries the magazine to a lead frame discharge position, and then moves the magazine onto the unloader stage, and the unique structure according to the present invention is that the elevator is provided with a chucking means for securely holding the magazine therein.

With the structure described above, when the elevator receives a magazine at the loader stage, the magazine is securely held by the chuck device which is built into the elevator. Then, with the magazine positionally secured in the elevator by the chuck device, the elevator is raised toward the unloader stage. When the elevator has been moved to a lead frame discharge position which is located before the unloader stage, the lead frames are discharged from the magazine. When the magazine is emptied, the elevator is further moved so that the magazine is brought to the unloader stage. Then, the chuck device releases the magazine so that the magazine is transferred onto the unloader stage.

BRIEF DESCRIPTION OF THE INVENTION

DETAILED DESCRIPTION OF THE INVENTION

The magazine carrying apparatus is installed at the end of a lead frame guide 2, which guides lead frames 1 to and from a magazine 9.

Figure 1:
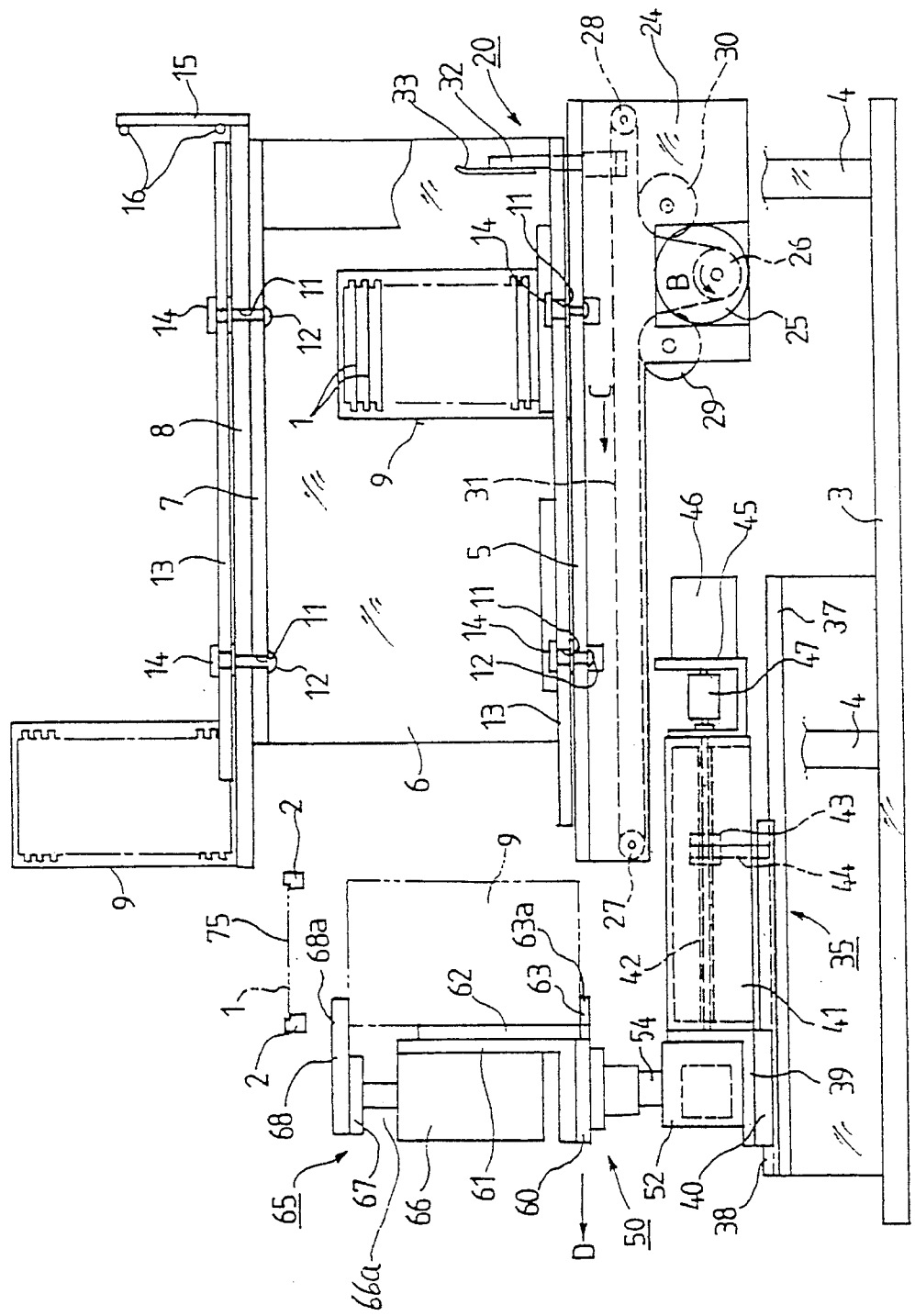
FIG. 1 is a front view of one embodiment of the magazine carrying apparatus according to the present invention.
Figure 2:
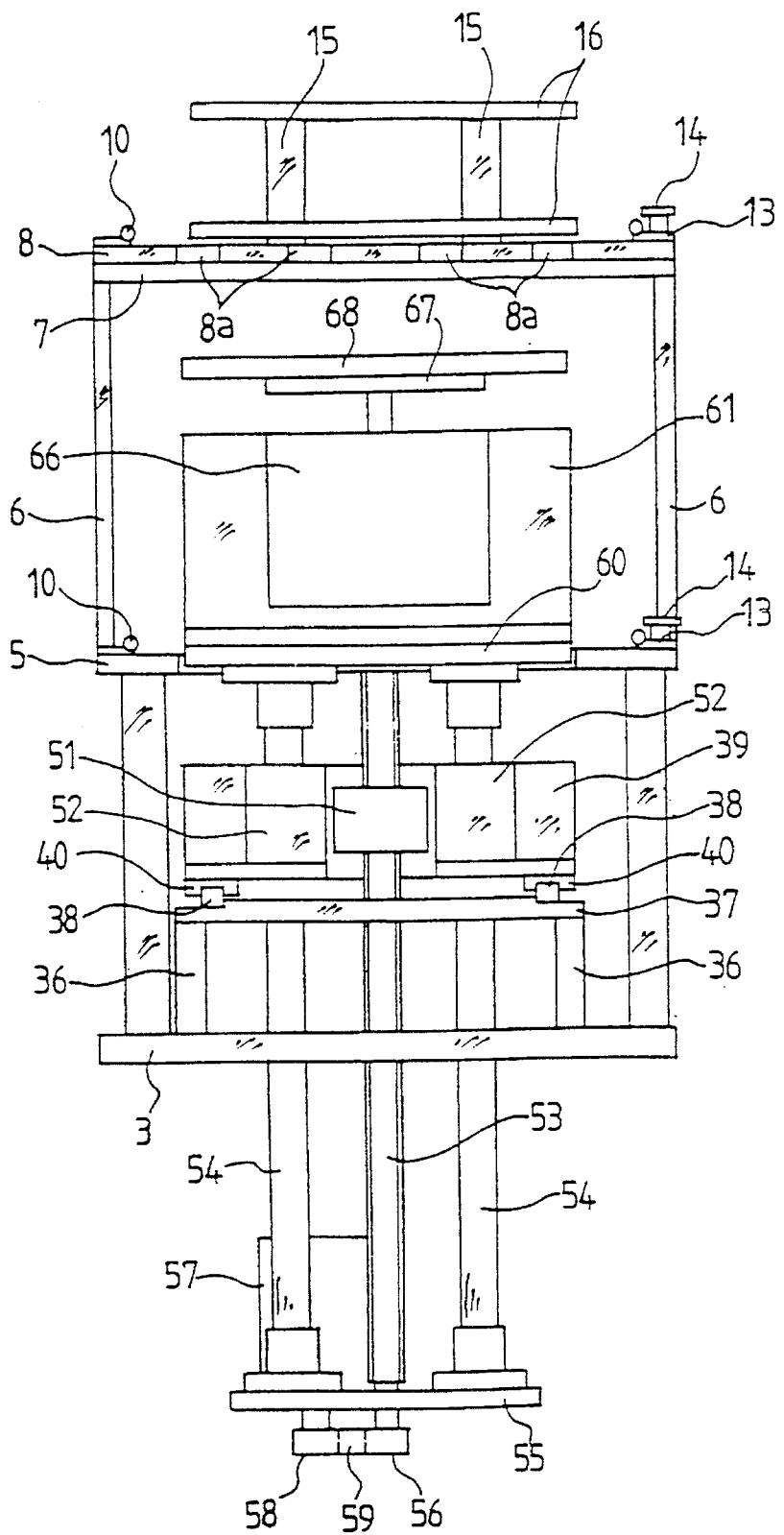
FIG. 2 is a side view thereof.
Figure 4:
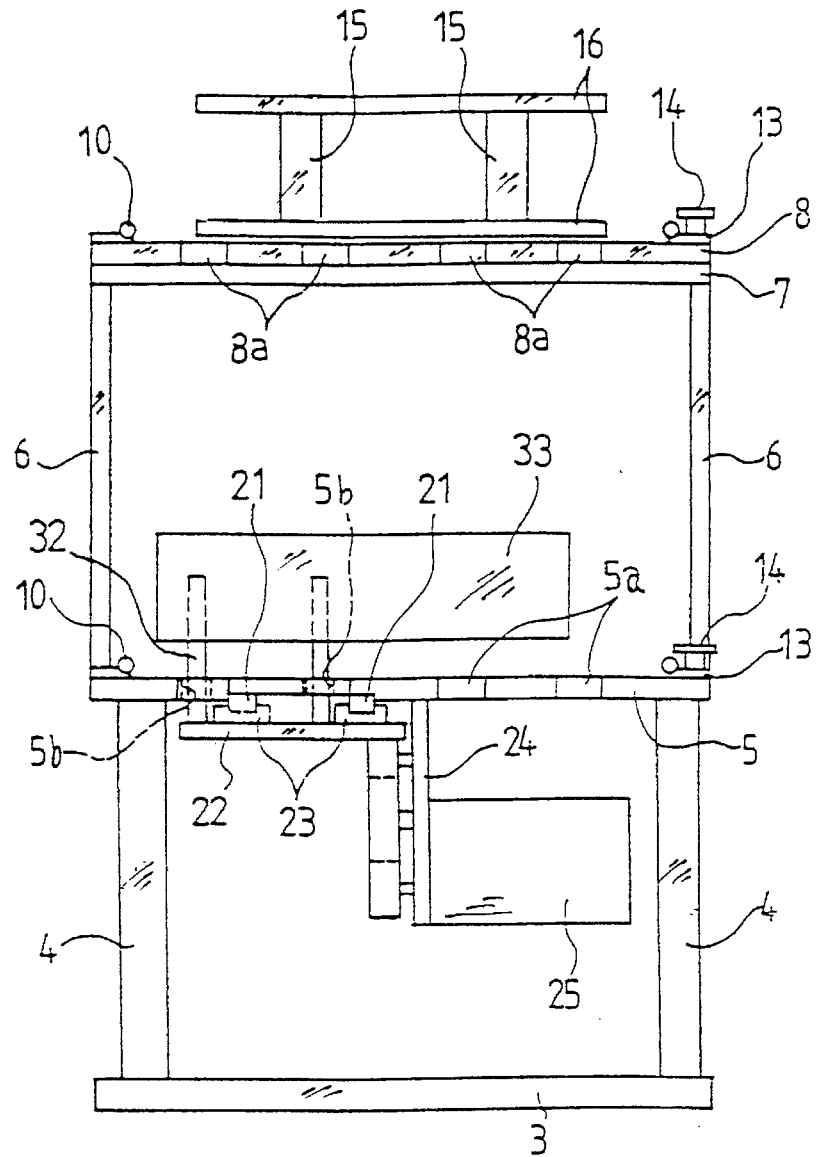
FIG. 4 is side view thereof with the elevator and the horizontally moving device omitted.

As shown in FIGS. 1, 2 and 4, a loader stage 5 is provided on a base plate 3 via a strut 4. Above this loader stage 5, a stage support plate 7 is installed so that the stage support plate 7 is fixed to a support plate 6, and an unloader stage 8 is provided on this stage support plate 7. In other words, the loader stage 5 and the unloader stage 8 form a two-tiered structure, or they are positioned vertically so that the unloader stage 8 is above the loader stage 5.

The space between the loader stage 5 and the stage support plate 7 is set so that it is wider than the height of the magazine 9 that is placed on the loader stage 5 and on the unloader stage 8.

The loader stage 5 is located below the frame guide 2, and the unloader stage 8 is located above the frame guide 2.

Figure 3:
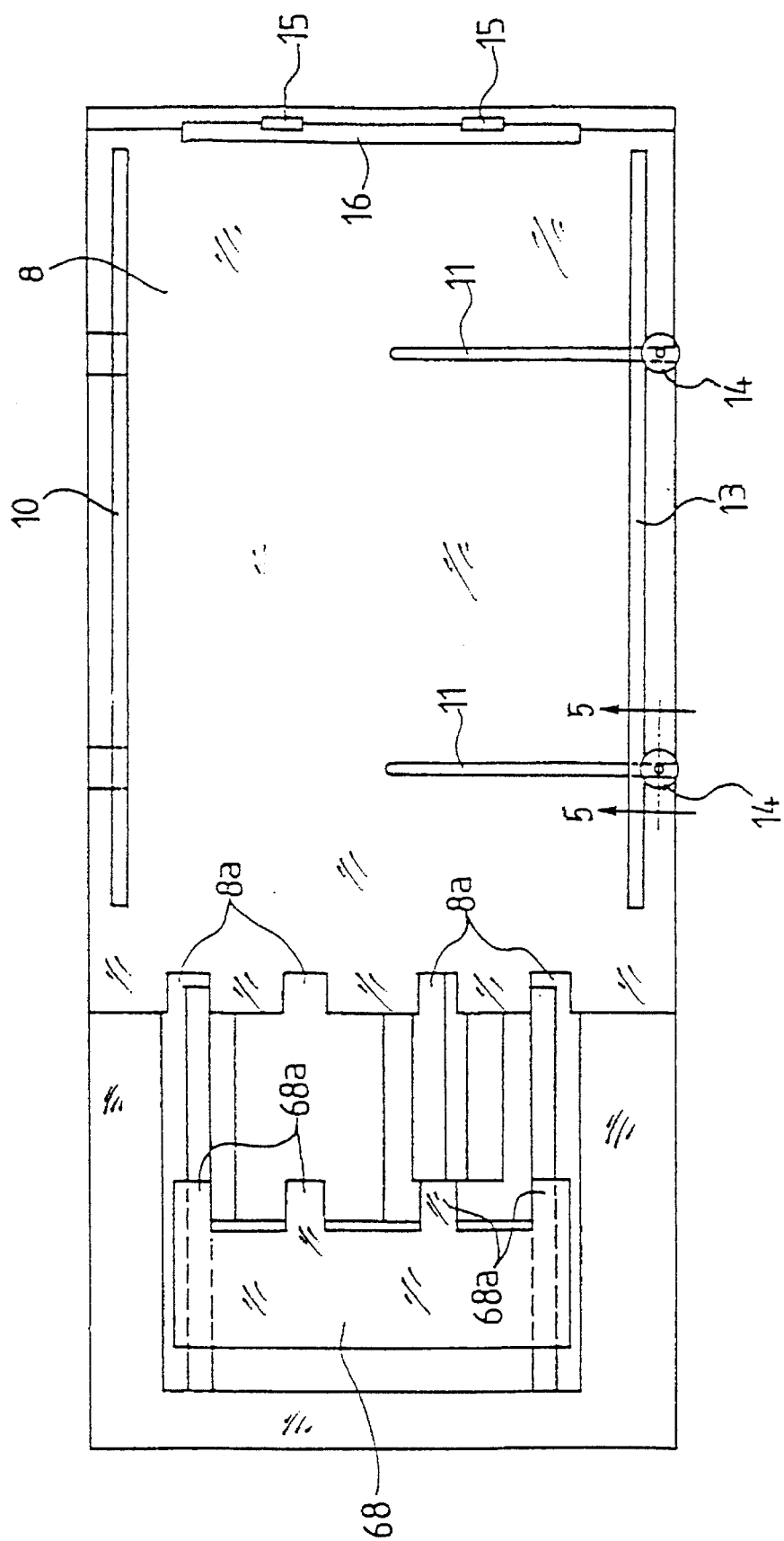
FIG. 3 is a top view thereof.
Figure 5:
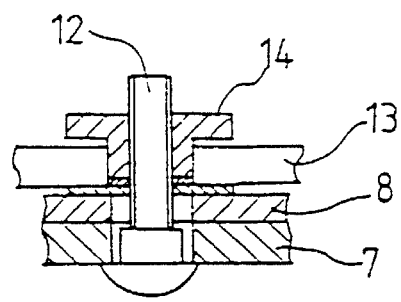
FIG. 5 is a cross section taken along the line 5—5 in FIG. 3.

As shown in FIGS. 1, 3 and 5, and particularly in FIGS. 3 and 5, an upper fixed guide 10, which guides the magazine 9, is provided on top of one side of the unloader stage 8. On the other side of the support stage 7 and unloader stage 8, lateral grooves 11 are formed in the direction of the upper fixed guide 10.

Cup square neck bolts 12 are inserted, with the heads downward, in the lateral grooves 11, and an upper movable guide 13 is inserted in these bolts 12. Thus, when the nuts 14 are loosened and the upper movable guide 13 are pushed so that the bolts 12 are moved into the lateral grooves 11, the distance between the upper fixed guide 10 and the upper movable guide 13 is adjusted so as to be equal to the depth of the magazine 9.

Once such a distance has been adjusted, the movable guide 13 is positionally fixed in the unloader stage 8 by tightening back the nuts 14.

Likewise, for the loader stage 5 (see FIGS. 1 and 4), a lower fixed guide 10 is provided on top of one side of the loader stage 5, and lateral grooves 11 are formed on the other side. Cup square neck bolts 12 are inserted in the lateral grooves 11, and a lower movable guide 13 is inserted into the bolts 12.

As seen from FIGS. 1, 3 and 4, a stopper support 15 is fixed at one end (right end in FIG. 1) of the unloader stage 8, and stopper bars 16, which are for stopping the magazine 9, are provided on this stopper support 15. At the other end (left end in FIG. 1) of the unloader stage 8, a plurality of upper cutouts 8a are formed.

A plurality of lower cutouts 5a, exactly like cutouts 8a, are formed in the loader stage 5 so that the lower cutouts 5a positionally correspond to the upper cutouts 8a of the unloader stage 8.

As shown in FIGS. 1 and 4, a pusher device 20, which moves the magazine 9 to the left in FIG. 1, is provided in the loader stage 5. The pusher device 20 is structured in the following manner:

As seen in FIG. 4, guide rails 21 are provided on the bottom surface of the loader stage 5 so that the guide rails 21 extend left and right in FIG. 1. Guides 23 are provided on a guide plate 22 so that the guide 23 can slide on the guide rails 21. A support plate 24 is provided under the loader stage 5, and a pusher drive motor 25 is installed on the support plate 24. The output shaft of the pusher drive motor 25 has a timing pulley 26. Furthermore, as seen in FIG. 1, timing pulleys 27 and 28 are provided on the support plate 24, and timing pulleys 29 and 30 are provided on either side of the timing pulley 26.

A timing belt 31 is mounted on the timing pulleys 29, 27, 28 and 30, and a guide plate 22 is fixed to the timing belt 31 so that the guide plate 22 is located between the two timing pulleys 27 and 28. As shown in FIG. 4, two guide grooves 5b are formed in the loader stage 5 so as to be parallel to the guide rails 21. The guide grooves 5b extend for the entire length of the loader stage 5 except for the left and right ends (relative to FIG. 1) of the loader stage 5. Pusher support plates 32, which are fixed on the guide plate 22, are inserted in the guide grooves 5b, and a pusher 33 for pushing the magazine 9 is provided onto the pusher support plate 32.

Back to FIG. 1, an elevator 50 is provided on the left side of the loader and unloader stages 5 and 8 so that the elevator 50 can be moved not only vertically but also horizontally to the left and right by a horizontal drive means 35. The structure of the horizontal drive means 35 will be explained.

As shown in FIGS. 1 and 2, an elevator stage 37 is provided on the base plate 3 by support plates 36. Guide rails 38 are provided on the elevator stage 37 so as to be parallel to the guide rails 21. Guides 40 are fixed on the under surface of a horizontally moving member 39 and fitted into the guide rails 38 so that the guide 40 can slide on the guide rails 38.

A box-shaped support body 41, which is open at the bottom, is attached to the side surface of the horizontally moving member 39, and a male screw 42 is supported by the support body 41 so as to be able to rotate. A female screw 43 is provided on the male screw 42 and is connected to the elevator stage 37 by a support plate 44. A horizontal motor 46 for moving the elevator 50 horizontally is fixed to the support body 41 via a bracket 45. The output shaft of the horizontal motor 46 is connected to the end (right end in FIG. 1) of the male screw 42 via a coupling 47.

The elevator 50 for carrying the magazine 9 vertically is structured as described below.

The horizontally moving member 39 has a female screw 51 at the center, and bearings 52 are provided on both sides of the female screw 51. A vertical male screw 53 is provided so as to mesh with the female screw 51, and guide axles 54 are fitted into bearings 52 in a manner that is slidable vertically. The lower end of the male screw 53 is held by a support plate 55 so that the male screw 53 is rotated. The lower end of each guide axle 54 is fixed to the support plate 55. A timing pulley 56 is attached to the lower end of the male screw 53 that protrudes downwardly from the support plate 55.

A vertical motor 57 for making a vertical motion of the elevator is provided on the support plate 55, and a timing pulley 58 is attached to the output shaft of the vertical motor 57. A timing belt 59 is mounted on the timing pulleys 56 and 58. The top end of the male screw 53 is connected to an ascending/descending plate 60 in a rotatable fashion, and the top of each guide axle 54 is fixed to the ascending/descending plate 60. An L-shaped support plate 61 is provided on the ascending/descending plate 60, and a positioning plate 62, which abuts the side of the magazine 9, is fixed on the support plate 61. A magazine holder 63, on which the magazine 9 is loaded, is fixed at the lower end of the positioning plate 62.

A chuck device 65 for positionally securing the magazine 9 on the elevator 50 is built in the elevator 50. More specifically, the chuck device 65 includes an air cylinder 66, which is provided on the support plate 61, and a support plate 67 is attached to the end of the operating rod 66a of the cylinder 66. The air cylinder 66 is installed so that the operating rod 66a is oriented vertically. A chuck plate 68 is fixed to the support plate 67 as a vertical counterpart of the magazine holder 63. Magazine holder ends 63a, which are protruding ends of the magazine holder 63, and chuck projections 68a, which are protruding ends of the chuck plate 68, are shaped so as to enter into, respectively, lower cutouts 5a of the loader stage 5 and upper cutouts 8a of the unloader stage 8.

The operation of the magazine carrying apparatus as described above will be explained below.

Prior to starting, the elevator 50 is in the lowered position or at the same level as the loader stage 5. Thus, the magazine holder end 63a of the magazine holder 63 is located inside the lower cutouts 5b of the loader stage 5. In this case, the upper surface of the magazine holder end 63a is positioned slightly below the upper surface of the loader stage 5.

A plurality of magazines 9, each containing a plurality of lead frames 1 vertically stacked therein as seen in FIG. 1, are loaded on the loader stage 5. FIG. 1 shows only one magazine 9.

When a start button is pushed, the pusher drive motor 25 is actuated, and the timing pulley 26 is rotated in the direction of arrow B. As a result, the timing belt 31 is rotated in the direction of arrow C, and the support plate 24, pusher support plate 32 and pusher 33 are moved in the same direction, thus pushing the magazine 9 on the loader stage 5 toward the elevator 50 until the magazine 9 abuts the positioning plate 62 of the elevator 50 and is thus positioned.

Next, the air cylinder 66 of the chuck device 65 is actuated. In other words, the chuck plate 68 is lowered by the operation rod 66a of the air cylinder 66 so that the magazine 9 is held down by the chuck projections 68a. In other words, the magazine 9 is held between the chuck projections 68a and the magazine holder ends 63a as indicated by the dotted lines in FIG. 1. However, as described above, the upper surfaces of the magazine holder ends 63a are positioned slightly below the upper surface of the loader stage 5; accordingly, the magazine 9 is not yet securely held between the chuck projections 68a and the magazine holder end 63a.

Next, the vertical motor 57 is actuated so that the elevator 50 is raised. More specifically, when the vertical motor 57 is actuated, the rotation of the output shaft of the motor 57 is transmitted to the male screw 53 via the timing pulley 58, timing belt 59, and timing pulley 56.

As described above, the female screw 51, which is on the male screw 53, is fixed to the horizontally moving member 39, and this horizontally moving member 39 is slidable on the guide rails 38 via the guides 40. Accordingly, the female screw 51 cannot move in a vertical direction. As a result, the male screw 53 is moved upward, thus pushing up the ascending/descending plate 60, positioning plate 62, and magazine holder 63. When magazine holder 63 is raised slightly, the chuck projections 68a can push the magazine 9 against the magazine holder 63. Thus, the magazine 9 is securely held between and by the chuck projections 68a and the magazine holder ends 63a.

When the elevator 50 is thus raised slightly, the horizontal drive device 35 is operated. In other words, the horizontal motor 46 is actuated when the elevator 50 is raised, and the rotation of the output shaft of the motor 46 is transmitted to the male screw 42. The female screw 43 is provided on the male screw 42 and also provided to the elevator stage 37 via the support plate 44. Accordingly, the support body 41 and horizontally moving member 39 are moved in the direction of arrow D, and the positioning plate 62 of the elevator 50 is separated from the loader stage 5. FIG. 1 shows the thus moved elevator 50.

When the elevator 50 is raised and horizontally moving member 39 is moved in the direction of arrow D a predetermined distance, the uppermost lead frame 1 in the magazine 9, which is being securely held in the elevator 50, is positioned in front of a lead frame discharge position 75 or in front of the lead frame guides 2. A pusher (not shown) is operated, and the uppermost lead frame 1 of the magazine 9 is discharged onto the lead frame guide 2.

When the uppermost lead frame 1 is thus discharged, the vertical motor 57 is actuated, so that the elevator 50 is further raised, and the second uppermost lead frame in the magazine 9 is moved to the lead frame discharge location 75. When there is a demand for the lead frame from the bonding apparatus, the second lead frame 1 is discharged by the pusher. This operation is repeated.

When all the lead frames 1 in the magazine 9 are discharged, the vertical motor 57 is actuated, and the elevator 50 is further raised. The horizontal motor 46 is also actuated in a direction opposite to the direction that has moved the elevator 50 in the arrow D direction. Thus, the magazine holder ends 63a of the magazine holder 63 is moved into the upper cutouts 8a of the unloader stage 8. The magazine holder 63 is positioned slightly above the unloader stage 8.

Next, the cylinder 66 of the chuck device 65 is actuated so that the chuck plate 68 is moved upward. Thus, the chucking of the magazine 9 by the chuck device 65 terminates. Then, the vertical motor 57 is actuated so that the elevator 50 is lowered. As a result, the magazine 9, which is on the magazine holder 63, is moved onto the unloader stage 8. The elevator 50 is further lowered and moved to its original position, where the elevator 50 can receive the next magazine from the loader stage 5.

The operation described above is repeated.

The magazine 9 which has been transferred onto the unloader stage 8 is pushed to the right in FIG. 1 toward the stopper bar 16 by the next magazine which is brought onto the unloader stage 8 by the action of the elevator 50.

When, on the other hand, the pusher 33 of the pusher device 20 has pushed the last magazine onto the elevator 50 from the loader stage 5, the pusher drive motor 25 turns in the reverse direction so as to return the pusher 33 to its original position to wait for new magazines.

The above description is made on the magazine 9 that contains lead frames and is placed on the loader stage 5 so that the lead frames in the magazine are discharged at the lead frame discharge position 75. However, instead of using a magazine with lead frames stored therein, it is possible to use empty magazines. In this case, an empty magazine is set on the loader stage 5, and a lead frame filling position is used instead of the lead frame discharge position 75. With this arrangement, the lead frames on the lead frame guide 2 can be put into the magazine 9 by a pusher or by other means, and the magazine 9 filled with the lead frames is transferred to the unloader stage 8.

In addition, instead of installing the unloader stage 8 above the loader stage 5, the loader stage 5 can be installed above the unloader stage 8. In this arrangement, the lead frames are discharged when the elevator 50 is lowered.

As described above, according to the present invention, the elevator that transfers a magazine from a loading stage to an unloader stage is provided with a chuck device. Accordingly, the magazine can be securely held in the elevator, and an easy discharge and filling operation of the lead frames out of and into the magazine can be accomplished. In addition, it is possible to run the elevator at a high speed.

I claim:

1. An apparatus for carrying a magazine comprising:

a magazine loader stage;

a magazine unloader stage which is provided above said loader stage, a vertically moving elevator which receives said magazine from said loader stage and transfers said magazine onto said unloader stage, said elevator being provided with a magazine chucking means which comprises:

an air cylinder provided in said elevator so that an operating rod of said air cylinder is set in a vertical direction, a support plate attached to an end of said operating rod of said air cylinder, a chuck plate attached to said support plate, said chuck plate having a plurality of chuck projections; and a magazine holder provided at a bottom of said elevator, said magazine holder having magazine holder ends so that said magazine is securely held between said chuck projections and said magazine holder ends when said air cylinder is actuated.

2. An apparatus according to claim 1, wherein said loader stage is provided with cutouts into which said magazine holder ends can be entered, and said unloader stage is provided with cutouts into which said chuck projections of said chuck plate can be entered.

* * * * *